United States Patent
Moons et al.

(10) Patent No.: US 8,165,283 B2
(45) Date of Patent: Apr. 24, 2012

(54) ADVANCED ADSL SPLITTER

(75) Inventors: Elvé Desiderius Jozef Moons, Lummen (BE); Kristof Moesen, Zaventem (BE); Jean-Michel Redoute, Heverlee (BE)

(73) Assignee: Alcatel Lucent, Paris (FR)

( * ) Notice: Subject to any disclaimer, the term of this patent is extended or adjusted under 35 U.S.C. 154(b) by 1562 days.

(21) Appl. No.: 11/592,310

(22) Filed: Nov. 3, 2006

(65) Prior Publication Data
US 2007/0127710 A1 Jun. 7, 2007

(30) Foreign Application Priority Data

Nov. 4, 2005 (EP) ..................... 05292346

(51) Int. Cl.
*H04M 9/00* (2006.01)
*H04M 1/76* (2006.01)
*H04M 7/00* (2006.01)

(52) U.S. Cl. .................. 379/416; 379/399.01

(58) Field of Classification Search ............. 379/399.01, 379/416
See application file for complete search history.

(56) References Cited

U.S. PATENT DOCUMENTS

| 6,137,880 | A | 10/2000 | Bella | |
|---|---|---|---|---|
| 7,457,405 | B2 * | 11/2008 | Bailey | 379/399.01 |
| 2003/0058840 | A1 * | 3/2003 | Doose | 370/352 |
| 2003/0112960 | A1 * | 6/2003 | Wang | 379/387.02 |

FOREIGN PATENT DOCUMENTS

| EP | 0 923 221 A1 | 6/1999 |
|---|---|---|
| EP | 0 966 146 A2 | 12/1999 |
| EP | 0 967 736 A1 | 12/1999 |
| EP | 1 089 536 A1 | 4/2001 |
| WO | WO 00/48314 A1 | 8/2000 |
| WO | WO 01/15424 A1 | 3/2001 |
| WO | WO 01/28088 A1 | 4/2001 |

* cited by examiner

*Primary Examiner* — Alexander Jamal
(74) *Attorney, Agent, or Firm* — Harness, Dickey & Pierce, P.L.C.

(57) ABSTRACT

A telecommunication filter arrangement comprising two similar filter cells (T1, S1$a$, S1$b$, R1$a$, R1$b$; T2, S2$a$, S2$b$, R2$a$, R2$b$) coupled in cascade to provide a POTS/ADSL splitter. The filter arrangement further comprises at third filter cell (C3, R3, S3) coupled in-between the two other filter cells and comprising a cell capacitor (C3) series coupled with the parallel connection of a cell coil (S3) and a cell resistor (R3). A 3$^{rd}$ order filter is so provided and the filter arrangement behaves as known 5th order filter but with a fixed "switchable insertion loss circuit". This filter arrangement is thereby cheap, simple and has a small size with respect to the known filter arrangements, while providing good performances.

5 Claims, 1 Drawing Sheet

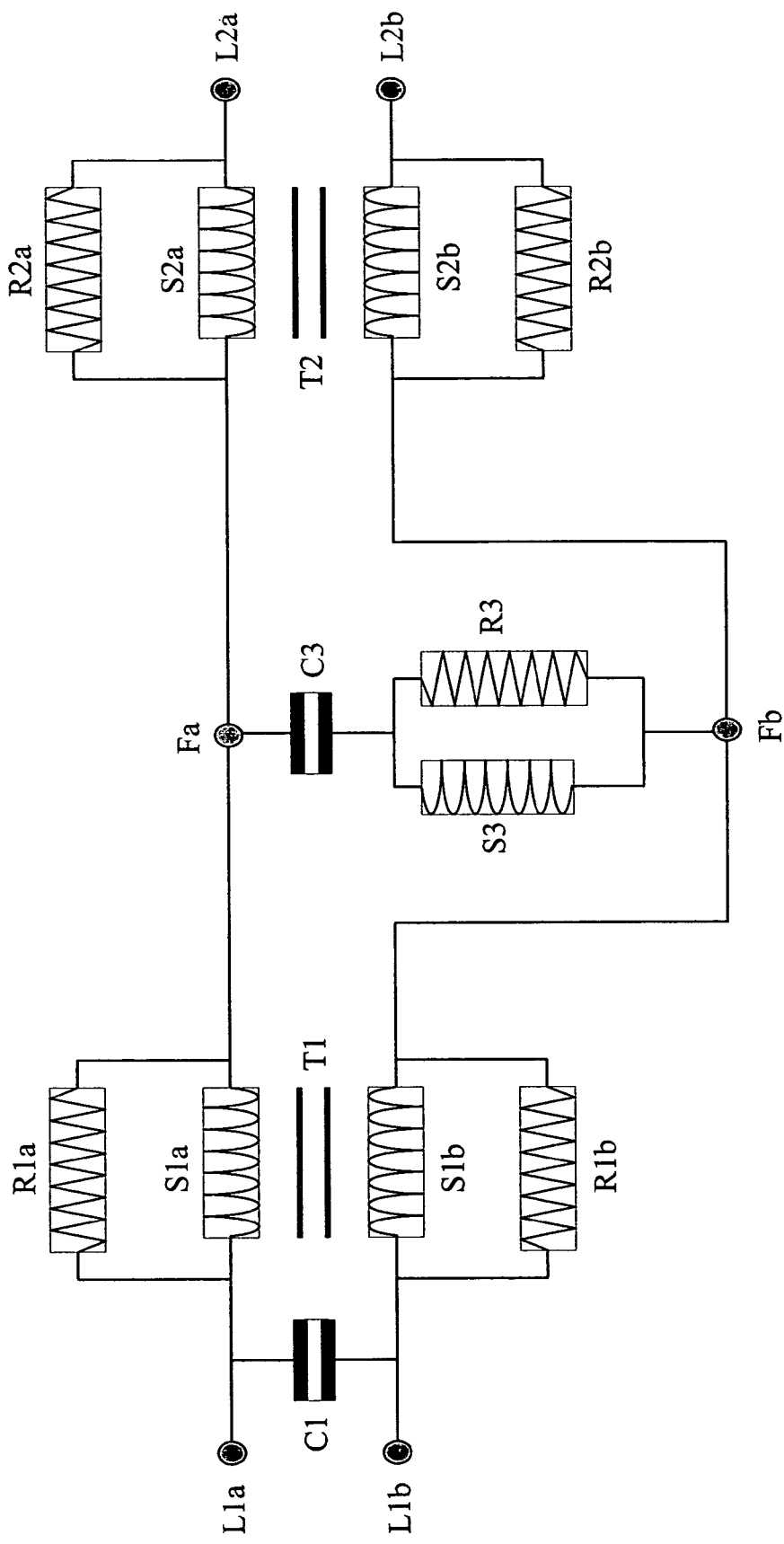

ADVANCED ADSL SPLITTER

The present invention relates to a telecommunication filter arrangement comprising at least a first filter cell and a second filter cell coupled in cascade between a first filter arrangement port and a second filter arrangement port, each filter cell comprising a transformer of which each winding is coupled in parallel with a resistor.

Such a telecommunication filter arrangement is already known in the art, e.g. in the field of splitters for Asymmetric Digital Subscriber Line (ADSL)—Plain Old Telephone Service (POTS). The filter arrangement is used to prevent high frequency ADSL signals from interfering with the lower frequency POTS signals, and also to prevent high frequency transients from the POTS from interfering with the ADSL signals.

A filter arrangement is generally a $5^{th}$ order filter constituted by passive LC filters with bulky coils and coupled in cascade. Because of the bulky coils, the filter arrangement has to be located on different boards, or even shelfs, which take much space/volume per telecommunication line and consequently leads to a relatively high cost.

A first solution to reduce this cost and the high volume per line is proposed by the European Patent Application EP-A-0 967 736 (26.06.1998—P. Reusens). Therein, a switched capacitor is used to change the filter arrangement characteristics when the phone (POTS) goes off-hook, as well as to reduce the effect of multiple filters on a line. It may for instance change the filter arrangement from a $2^{nd}$ order filter to a $4^{th}$ order filter, and vice versa.

Such a known filter arrangement remains bulky, costly and relatively complex because of the presence of the switched capacitor and its associated detection circuit.

An improvement of this known filter arrangement is proposed by the International Patent Application WO-A1-0 128 088 (14.10.1999—B. Orr). Therein is disclosed a switchable insertion loss circuit for splitters. This other known filter arrangement uses a switched impedance as return loss correction circuit inserted on the low frequency side of the filter arrangement to change the filter characteristics.

This other known filter arrangement is a $5^{th}$ order filter with still bulky coils and complex circuitry located at one side of the filter arrangement. As a consequence, it has no sufficient performances. In other words, the combination of filtering performance, transient suppression, insertion loss and return loss is not sufficient.

An object of the present invention is to provide a telecommunication filter arrangement of the above known types but overcomes the drawback of being bulky, costly, complex and not sufficiently performant.

According to the invention, this object is achieved due to the fact that said telecommunication filter arrangement further comprises at third filter cell coupled between said first and said second filter cell, and that said third filter cell comprises a cell capacitor series coupled with the parallel connection of a cell winding and a cell resistor.

In this way, a $3^{rd}$ order filter is provided instead of a $5^{th}$ order filter as known from the prior art. Moreover, although the architecture of the filter arrangement of the present invention resembles the one disclosed in the above-mentioned prior art, the "switchable insertion loss circuit" is replaced by a fixed one, placed in between the two filter cells, i.e. no longer at one side of the filter arrangement. As a result, the present filter arrangement is achieved at relatively low cost, is not complex and has a relatively small size while providing good performances.

Further characterizing embodiments of the present telecommunication filter arrangement are mentioned in the appended claims.

It is to be noticed that the term 'comprising', used in the claims, should not be interpreted as being restricted to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

The above and other objects and features of the invention will become more apparent and the invention itself will be best understood by referring to the following description of an embodiment taken in conjunction with the accompanying drawing wherein the FIGURE represents a telecommunication filter arrangement according to the invention.

The telecommunication filter arrangement of which the architecture is shown in the FIGURE is preferably used as a splitter for Asymmetric Digital Subscriber Line (ADSL)—Plain Old Telephone Service (POTS). The filter arrangement prevents high frequency ADSL signals (or more generally XDSL signals) from interfering with the lower frequency POTS signals, and also prevents high frequency transients from the POTS from interfering with the ADSL signals.

To this end, the filter arrangement comprises a cascade of filter cells between a first filter arrangement port coupled to a Plain Old Telephone Service (POTS) subscriber set (not shown) and a second filter arrangement port coupled to a telecommunication line of an Asymmetric Digital Subscriber Line (ADSL) telecommunication system. The first filter arrangement port comprises a first filter arrangement terminal L1a and a second filter arrangement terminal L1b, whilst the second filter arrangement port comprises a third filter arrangement terminal L2a and a fourth filter arrangement terminal L2b. A capacitor C1 is connected between the filter arrangement terminals L1a and L1b.

A first filter cell is coupled between the first filter arrangement port having the terminals L1a and L1b and an intermediated filter arrangement port having terminals Fa and Fb. A second filter cell is coupled between the terminals Fa and Fb of the intermediated filter arrangement port and the second filter arrangement port having the terminals L2a and L2b. Each of the first and second filter cell comprises a transformer T1; T2 each having a first S1a; S2a and a second S1b; S2b winding or coil.

In more detail, for the first filter cell, the first transformer winding S1a is coupled between the terminals L1a and Fa, and is connected in parallel with a first resistor R1a, whilst the second transformer winding S1b is coupled between the terminals L1b and Fb, and is connected in parallel with a second resistor R1b.

On the other hand, the first transformer winding S2a of the second filter cell is coupled between the terminals Fa and L2a, and is connected in parallel with a third resistor R2a, whilst the second transformer winding S2b of this second filter cell is coupled between the terminals Fb and L2b, and is connected in parallel with a fourth resistor R2b.

The telecommunication filter arrangement further comprises at third filter cell coupled between the first and the second filter cell, and between the intermediate filter arrangement terminals Fa and Fb. This third filter cell comprises a cell capacitor C3 series coupled with the parallel connection of a cell winding or coil S3 and a cell resistor R3.

A $3^{rd}$ order filter is so created with the third filter cell located in-between to similar filter cells. This telecommunication filter arrangement behaves as the above mentioned 5th order filter known from the prior art but with a fixed "switchable insertion loss circuit".

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is merely made by way of example and not as a limitation on the scope of the invention, as defined in the appended claims.

The invention claimed is:

1. A telecommunication filter arrangement comprising: at least a first filter cell and a second filter cell coupled in cascade between a first filter arrangement port and a second filter arrangement port,
    each filter cell comprising a transformer of which each winding is coupled in parallel with a resistor,
    the transformer of each of said first and second filter cell comprises a first winding coupled in parallel with a first resistor and a second winding coupled in parallel with a second resistor,
    said first filter arrangement port includes a first filter arrangement terminal and a second filter arrangement terminal,
    said second filter arrangement port includes a third filter arrangement terminal and a fourth filter arrangement terminal,
    said first filter arrangement terminal is coupled to said third filter arrangement terminal via the series coupling of the first windings of the transformers of said first and second filter cells, and
    said second filter arrangement terminal is coupled to said fourth filter arrangement terminal via the series coupling of the second windings of the transformers of said first and second filter cells, and wherein
    said telecommunication filter arrangement further includes a third filter cell coupled between said first and said second filter cell,
    said third filter cell is coupled between the first windings of the transformers of said first and second filter cells, and the second windings of the transformers of said first and second filter cells, and
    said third filter cell includes a cell capacitor series coupled with the parallel connection of a cell winding and a cell resistor.

2. The telecommunication filter arrangement according to claim 1, wherein a second capacitor is coupled between said first and said second filter arrangement terminal.

3. The telecommunication filter arrangement according to claim 1,
    wherein said first filter arrangement port is coupled to a Plain Old Telephone Service subscriber set,
    and wherein said second filter arrangement port is coupled to a telecommunication line of an Asymmetric Digital Subscriber Line telecommunication system.

4. The telecommunication filter arrangement according to claim 1,
    wherein the filter arrangement is a third-order filter.

5. The telecommunication filter arrangement according to claim 1,
    wherein the filter arrangement exhibits fifth-order frequency response.

* * * * *